United States Patent [19]

Iwasaki

[11] Patent Number: 4,484,388

[45] Date of Patent: Nov. 27, 1984

[54] METHOD FOR MANUFACTURING SEMICONDUCTOR BI-CMOS DEVICE

[75] Inventor: Hiroshi Iwasaki, Chigasaki, Japan

[73] Assignee: Tokyo Shibaura Denki Kabushiki Kaishi, Japan

[21] Appl. No.: 504,161

[22] Filed: Jun. 14, 1983

[30] Foreign Application Priority Data

Jun. 23, 1982 [JP] Japan .................. 57-108069

[51] Int. Cl.$^3$ .................. H01L 21/225; H01L 21/20; H01L 21/76

[52] U.S. Cl. .................. 29/571; 29/576 E; 29/576 W; 29/577 C; 29/578; 148/175; 148/187; 148/188; 156/653; 156/657; 156/662; 357/43; 357/48; 357/49

[58] Field of Search ............ 29/571, 576 W, 576 E, 29/577 C, 578, 591; 148/174, 175, 187, 188; 156/653, 657, 662; 357/43, 48-50

[56] References Cited

U.S. PATENT DOCUMENTS

| | | | |
|---|---|---|---|
| 3,748,545 | 7/1973 | Beale .................. | 357/42 X |
| 3,767,487 | 10/1973 | Steinmaier .................. | 148/187 X |
| 3,971,059 | 7/1976 | Dunkley et al. .................. | 148/175 X |
| 3,978,515 | 8/1976 | Evans et al. .................. | 357/50 X |
| 3,999,213 | 12/1976 | Brandt et al. .................. | 29/571 X |
| 4,032,372 | 6/1977 | Vora .................. | 148/175 |
| 4,041,518 | 8/1977 | Shimizu et al. .................. | 29/571 X |
| 4,161,417 | 7/1979 | Yim et al. .................. | 148/175 |

FOREIGN PATENT DOCUMENTS 54-43688 4/1979 Japan .
54-148388 11/1979 Japan .

OTHER PUBLICATIONS

Castrucci et al., "Bipolar/FET High-Performance Circuit IBM Technical Disclosure Bulletin vol. 16, No. 8, Jan. 1974.

Polinsky, et al., "CMOS–BiPolar Monolithic Integrated–Circuit Technology," Technical Digest of IEEE, IEDM, pp. 229-231, Dec. 1973.

Primary Examiner—William G. Saba
Attorney, Agent, or Firm—Finnegan, Henderson, Farabow, Garrett & Dunner

[57] ABSTRACT

A method for forming a Bi-CMOS structure, wherein a vertical npn transistor and CMOS transistors are formed on a single semiconductor substrate, is disclosed. After forming a p-type epitaxial silicon layer on a p-type silicon substrate with a plurality of n+-type buried layers therein, n-type wells are formed to extend to the n+-type buried layers. Selective oxidation is performed to form field oxide films so as to define an n-type element region for the npn transistor, an n-type element region for the p-channel MOS transistor, and a p-type element region for the n-channel MOS transistor. An oxide film as a gate oxide film for the CMOS is formed on the surfaces of all the element regions. After forming a p-type active base region of the npn transistor by ion-implantation of boron, an emitter electrode comprising an arsenic-doped polysilicon layer is formed in contact with the p-type active base region. Gate electrodes of the CMOS are formed and have a low resistance due to doping with phosphorus and/or arsenic. Using the emitter electrode as a diffusion source, an n-type emitter region is formed. Boron is then ion-implanted to simultaneously form a p+-type external base region and p+-type source and drain regions of the p-channel MOS transistor. Phosphorus is ion-implanted to form an n+-type collector contact region and n+-type source and drain regions of the n-channel MOS transistor.

14 Claims, 19 Drawing Figures

METHOD FOR MANUFACTURING SEMICONDUCTOR BI-CMOS DEVICE

BACKGROUND OF THE INVENTION

The present invention relates to a method for manufacturing a semiconductor device and, more particularly, to an improvement in a method for manufacturing a semiconductor device which has, on a single semiconductor substrate, a bipolar transistor which has a high cutoff frequency and low power consumption, and complementary MOS (CMOS) transistors of a polysilicon gate structure, each of which has high speed switching characteristics and low power consumption.

A semiconductor device having a bipolar transistor and CMOS transistors on a single semiconductor substrate is generally known as a Bi-CMOS. FIG. 1 shows the structure of a conventional Bi-CMOS which is manufactured in the following manner.

First, a p-type silicon substrate 1 is prepared. An n+-type buried layer 2 of high impurity concentration is selectively formed in the silicon substrate 1 by diffusion. An n-type epitaxial layer 3 is grown on the entire surface of the silicon substrate 1. A p-type well 5 and a p+-type isolation region 4 for electrically isolating each circuit element are formed by thermal diffusion. The annealing time for forming the p-type well 5 is longer than that for forming the p-type isolation region 4. For this reason, the thermal diffusion process for forming the p-type well 5 is partially performed first. Subsequently, the remaining thermal diffusion process for forming the p-type well 5 is simultaneously performed with the thermal diffusion process for forming the p+-type isolation region 4. According to the conventional method, a bipolar transistor 6 is formed in a region surrounded by the p-type well 5 and the p+-type isolation region 4. A p-channel MOS transistor 8 which is one component of the complementary MOS transistors is formed in a region surrounded by the p-type well 5 and the p+-type isolation region 4. An n-type channel MOS transistor 7 which is the other component of the complementary MOS transistors is formed in the p-type well 5.

The conventional method as described above has the following problems. The first problem is undesired migration of an impurity. In the impurity diffusion annealing process for forming the p-type well 5 and the p+-type isolation region 4, the n-type impurity of the n+-type buried layer 2 migrates upward, so that the impurity concentration of the n-type epitaxial layer 3 cannot be controlled to a predetermined value. In the Bi-CMOS structure shown in FIG. 1, the impurity concentration of the n-type epitaxial layer 3 is directly related to the static characteristics and dielectric strength of the npn bipolar transistor and has a direct influence on a threshold voltage Vth of a p-channel bipolar transistor 8. For this reason, it has been difficult to obtain the desired stable characteristics with the Bi-CMOS structure as shown in FIG. 1 which is manufactured by the conventional method.

The second problem is the difficulty of achieving optimal characteristics of both the bipolar transistors and the CMOS transistors. Thus, it is difficult to obtain a Bi-CMOS structure wherein a bipolar transistor has a high cutoff frequency and low power consumption and CMOS transistors have a high switching speed. The main reasons for the second problem will now be explained with reference to FIG. 1. In the structure shown in FIG. 1, the source and drain regions of the n-channel MOS transistor 7 are formed simultaneously with the emitter region of the npn bipolar transistor 6. Also, the source and drain regions of the p-channel MOS transistor 8 and the base region of the npn bipolar transistor 6 are simultaneously formed. Accordingly, it is difficult to achieve conditions for obtaining optimal characteristics of both the npn transistor 6 and the CMOS transistors. More specifically, in order to obtain the npn bipolar transistor 6 having the desired characteristics, the emitter region must be as shallow as possible. In contrast to this, the source and drain regions of the n-channel MOS transistor 7 which are formed simultaneously with the emitter region of the npn bipolar transistor 6 must have a certain diffusion depth in order to prevent electrode spike (junction destruction due to migration of aluminum) during the manufacture of the aluminum electrode. Thus, the emitter region of the npn bipolar transistor 6 cannot be formed under the optimal conditions for forming the npn bipolar transistor 6. On the other hand, the source and drain of the p-channel MOS transistor 8 which are formed simultaneously with the base region of the npn bipolar transistor 6 are formed deeper than necessary. This restricts miniaturization of the p-channel MOS transistor 8 and causes an increase in the parasitic capacitance, thus impairing the switching characteristics of the CMOS transistors.

A method as shown in FIGS. 2A to 2C is already known as a method for solving the first problem discussed above, as in IBM Technical Disclosure Bulletin Vol. 16, No. 8, pp. 2719 to 2720. According to this method, using a thermal oxide film pattern 12 as a mask formed on a p-type silicon substrate 11, n+-type buried layers 13 are formed (FIG. 2A). Subsequently, after removing the thermal oxide film pattern 12, a p-type epitaxial layer 14 is grown. After forming a thermal oxide film 15 on the surface of the p-type epitaxial layer 14, an n-type impurity is ion-implanted through the thermal oxide film 15 so as to form n-type impurity diffusion sources 16 in the surface layer portion of the p-type epitaxial layer 14 on the n+-buried layers 13 (FIG. 2B). Then, annealing is performed to slump the diffusion sources 16 so as to form n-type wells 17 which reach to the n+-type buried layers 13 (FIG. 2C).

Thereafter, an npn bipolar transistor is formed on one n-type well 17, a p-channel MOS transistor is formed on the other n-type well 17, and an n-channel MOS transistor is formed on the p-type epitaxial layer 14.

According to the method as described above, the upward migration of the impurity from the n+-type buried layers 13 caused during formation of the n-type wells 17 shortens the slumping time for forming the n-type wells 17 but does not substantially affect the impurity concentration thereof.

The method shown in FIGS. 2A to 2C can solve the first problem encountered in the manufacture of the Bi-CMCS structure as described above. However, the second problem remains unsolved with this method.

SUMMARY OF THE INVENTION

It is an object of the present invention to provide a method for manufacturing a semiconductor device, which utilizes the method described with reference to FIGS. 2A to 2C to solve the first problem, and which solves the second problem, so that a Bi-CMOS structure may be obtained which has a bipolar transistor with a high cutoff frequency and a low power consumption and complementary MOS transistors with high switching speed characteristics.

It is still another object of the present invention to provide a method for manufacturing a semiconductor device which has complementary MOS transistors and a bipolar transistor free from the latch up phenomenon and which may be manufactured using a minimum number of steps.

In order to achieve the above and other objects of the present invention, there is provided a method for manufacturing a semiconductor device, comprising the steps of: selectively forming, in a surface layer of a semiconductor substrate of a first conductivity type, a plurality of high concentration buried layers having a second conductivity type, and growing an epitaxial semiconductor layer of the first conductivity type on an entire surface of said substrate; forming well regions of the second conductivity type which extend from a surface of said epitaxial semiconductor layer to said high concentration buried layers; selectively forming a field insulating film on the surface of said epitaxial semiconductor layer so as to form first conductivity type element regions and second conductivity type element regions surrounded by said field insulating film; forming a thin insulating film on surfaces of said element regions; selectively doping one of said second conductivity type element regions with a first conductivity type impurity so as to form a first conductivity type active base region of a bipolar transistor; forming gate electrodes of MOS transistors interposed with said thin insulating film on said first conductivity type element regions and remaining ones of said second conductivity type element regions in which said active base region is not formed, said gate electrodes comprising polysilicon layers which are doped with an impurity to have a low resistance; forming a second conductivity type emitter region in said first conductivity type active base region; selectively doping a second conductivity type impurity so as to simultaneously form a second conductivity type collector contact region of said bipolar transistor, and second conductivity type source and drain regions of said MOS transistors in said first conductivity type element region, said second conductivity type source and drain regions being self-aligned with said gate electrodes of said MOS transistors; and selectively doping a first conductivity type impurity so as to form an external base region of the first conductivity type in said first conductivity type base region and first conductivity type source and drain regions of said MOS transistors in said remaining ones of said second conductivity type element regions, said first conductivity type source and drain regions being self-aligned with said gate electrodes of said MOS transistors.

In the method of the present invention as described above, the step of forming the second conductivity type emitter region may be carried out at the same time as one or both steps of forming the second conductivity type collector contact region and of forming the second conductivity type source and drain regions.

In the method of the present invention, the active base region of the bipolar transistor is formed in a step separate from the step for forming the source and drain regions of the CMOS transistors. For this reason, the active base region may be formed at a diffusion depth and an impurity concentration which only give consideration to the optimal characteristics of the bipolar transistor, and give no consideration to the characteristics of the CMOS transistors.

Furthermore, in the method of the present invention, the source and drain regions of the CMOS transistors are not formed simultaneously with the active base region of the bipolar transistor, but are formed simultaneously with the external base region or collector contact region. In this case, the impurity concentration and diffusion depth required for forming the external base region and the collector contact region are substantially the same as those required for forming the source and drain regions of the CMOS transistors. Accordingly, the source and drain regions of the CMOS transistors may be formed giving consideration only to factors for miniaturization of the element, so that CMOS transistors having high switching speeds can be manufactured.

When the emitter region of the bipolar transistor is formed in a step separate from the steps for forming the source and drain regions of the CMOS transistors, the emitter region is formed under optimal conditions for forming the bipolar transistor without giving special consideration to the characteristics of the CMOS transistors. In this case, as will be described with reference to Examples hereinafter, a method is adopted wherein an emitter electrode of polysilicon doped with an impurity of the second conductivity type is formed, and the emitter region is formed using the emitter electrode as a diffusion source. As a result, the emitter region is formed in self-alignment with the emitter electrode and with a shallow junction, so that a bipolar transistor of high cutoff frequency and low power consumption is obtained. The emitter electrode as a diffusion source may be formed by patterning during formation of gate electrodes of polycrystalline silicon for the CMOS transistors. However, the impurity to be doped must be of the second conductivity type which is different from the case of forming the gate electrodes, and which has a small diffusion coefficient.

According to the general features of the present invention, since the polysilicon gate process is adopted for forming the CMOS structure, the source and drain regions are formed in self-alignment, which significantly contributes to miniaturization of elements and provision of high speed switching characteristics.

Since the method of the present invention adopts the good features of the method shown in FIGS. 2A to 2C, the upward migration of an impurity from a high concentration buried layer is not caused, thus preventing degradation of the static characteristics or dielectric strength of the bipolar transistor, or in the threshold voltage of the MOS transistor formed in the well region, thereby providing a high-performance Bi-CMOS structure.

DETAILED DESCRIPTION OF THE PREFERRED EMBODIMENTS

A method for manufacturing a Bi-CMOS structure according to the present invention will now be described by way of examples with reference to FIGS. 3A to 3J and 4 to 6.

EXAMPLE 1

Figure 1:
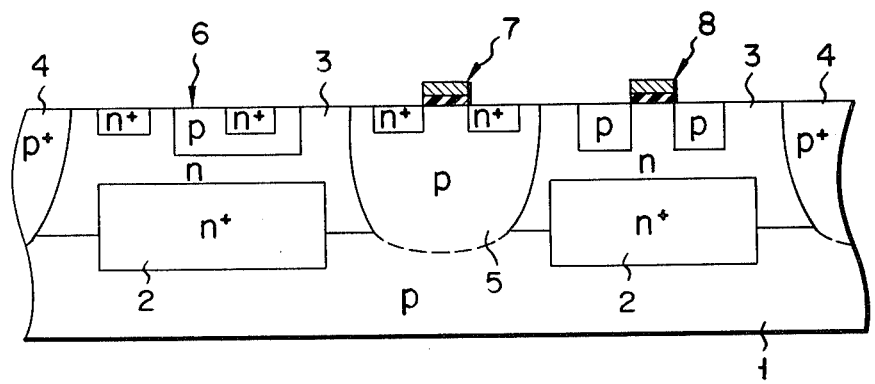
FIG. 1 is a sectional view for explaining a structure of a conventional Bi-CMOS structure and a method for manufacturing the same.
Figure 2A:
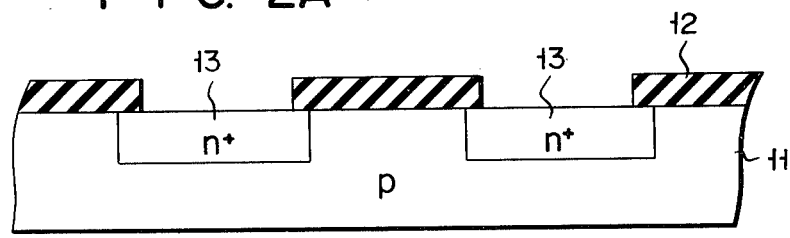
FIGS. 2A to 2C are sectional views for explaining an improved conventional method for manufacturing a Bi-CMOS structure.
Figure 2B:
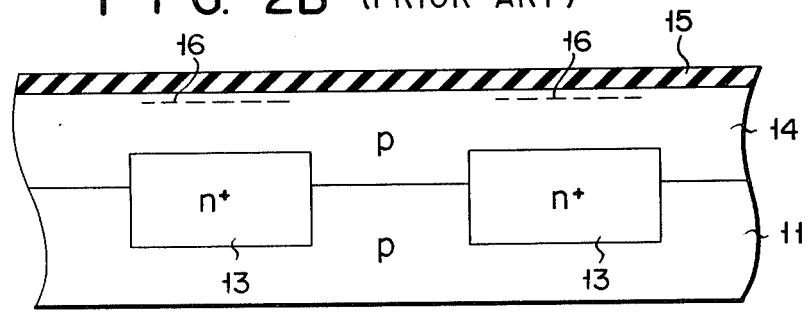
Figure 2C:
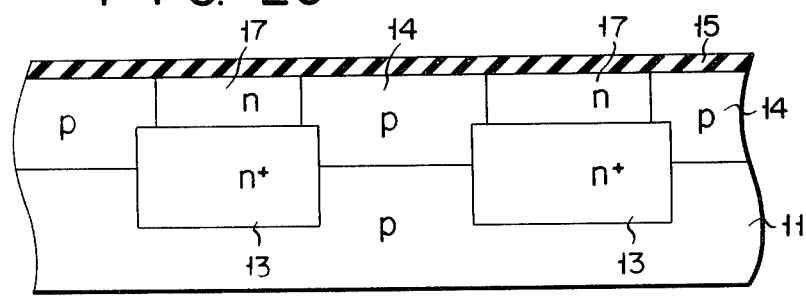
Figure 3A:
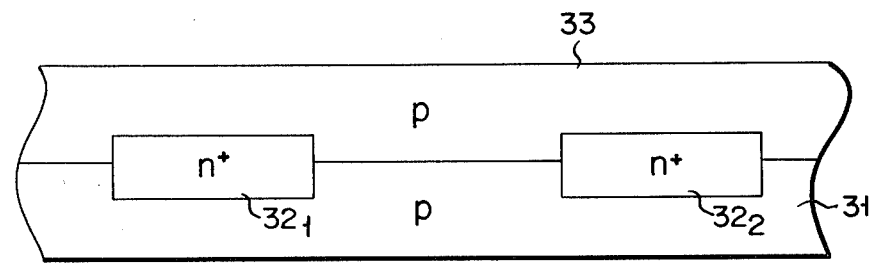
FIGS. 3A to 3J are sectional views showing in sequential order a method for manufacturing a Bi-CMOS structure according to an embodiment of the present invention.

(i) A silicon wafer as shown in FIG. 3A is prepared according to the method described with reference to FIGS. 2A to 2C.

More specifically, after forming a thermal oxide film on a p-type silicon substrate 31 having an impurity concentration of about to $10^{14}$ to $10^{17}/cm^3$, the thermal oxide film is selectively etched. Using the patterned thermal oxide film, arsenic (As) or antimony (Sb) is selectively doped to a high concentration of about to $10^{18}$ to $10^{20}/cm^2$ to form n+-type buried layers $32_1$ and $32_2$. A p-type epitaxial silicon layer 33 is then formed on the entire surface.

The p-type epitaxial silicon layer 33 has a thickness of 1 to 5 μm and a resistivity of 0.5 to 10 Ω·cm. However, these values are given only as typical values and may be set depending upon other conditions for obtaining a desired device.

Figure 3B:
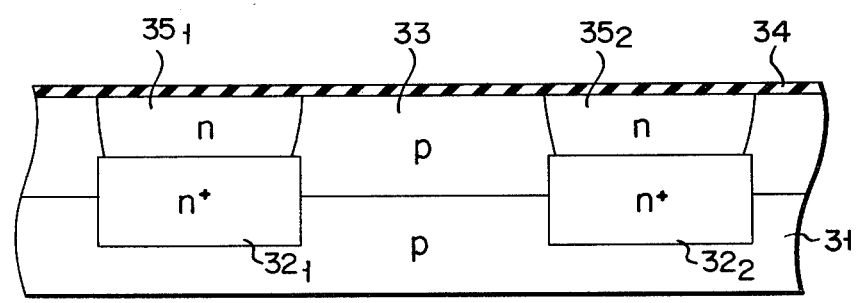

(ii) A thermal oxide film 34 of about 1,000 Å thickness is formed on the surface of the epitaxial silicon layer 33. Using the thermal oxide film 34 as a buffer mask, phosphorus is selectively ion-implanted to form phosphorus diffusion sources in the surface layer of the epitaxial silicon layer 33. Annealing is performed to diffuse the ion-implanted phosphorus to form n-type wells $35_1$ and $35_2$ which reach to the n+-type buried layers $32_1$ and $32_2$ (FIG. 3B).

Selective ion-implantation of phosphorus is performed using a resist pattern as a mask and under the conditions of an acceleration voltage of 150 keV and a dose of $2 \times 10^{12}/cm^2$. Thereafter, annealing is performed at a temperature of 1,190° C. so as to diffuse phosphorus to a depth of about 3 μm, thereby forming the n-type wells $35_1$ and $35_2$ having a phosphorus concentration of 8 to $10 \times 10^{-15}/cm^3$. During diffusion, the impurity diffuses upward from the n+-type buried layers $32_1$ and $32_2$. For this reason, the annealing time for forming the n-type wells $35_1$ and $35_2$ is shortened.

Figure 3C:
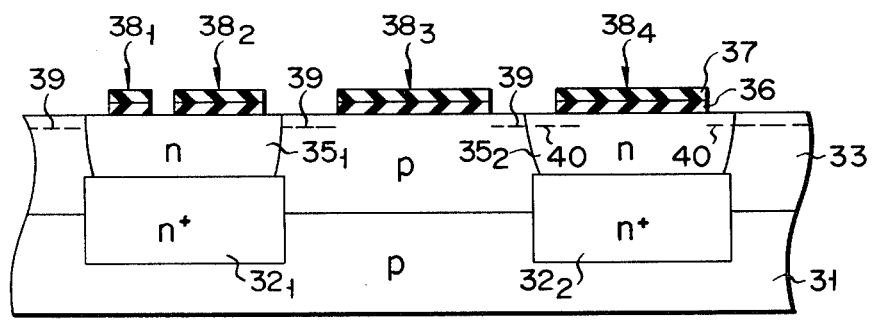

(iii) After removing the thermal oxide film 34, another thermal oxide film 36 of about 300 to 2,000 Å thickness is formed on the entire surface of the structure. Then, a silicon nitride film 37 is deposited thereover to a thickness of about 1,000 Å by the CVD method. Subsequently, a laminated film of the thermal oxide film 36 and the silicon nitride film 37 is patterned to form laminated film patterns $38_1$ and $38_2$ covering the prospective element regions of the npn bipolar transistor, a laminated film pattern $38_3$ covering the prospective element region of the n-channel MOS transistor, and a laminated film pattern $38_4$ covering the prospective element region of the p-channel MOS transistor. Then, in order to form a channel cut region for the CMOS transistors, ion-implantation 39 of boron using the laminated film pattern $38_3$ as a blocking mask, and ion-implantation 40 of phosphorus using the laminated film pattern $38_4$ as a blocking mask are performed sequentially (FIG. 3C).

During ion-implantations 39 and 40 for forming channel cut regions, the n-type well $35_1$ for forming the npn bipolar transistor is protected by a resist film or the like. When one of ion-implantations 39 and 40 is performed, the other region is protected by a resist pattern or the like.

Figure 3D:
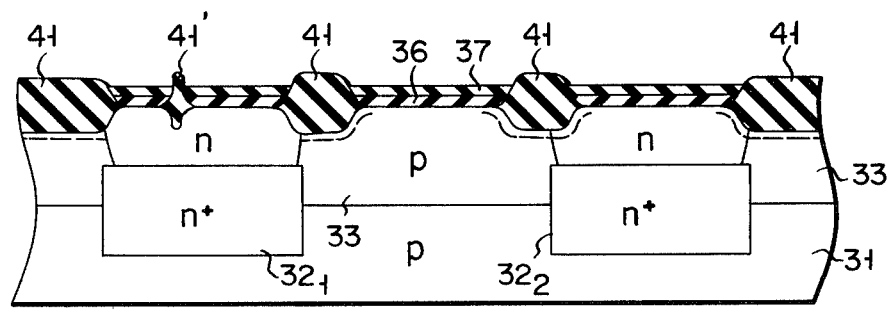

(iv) Selective oxidation is performed using the silicon nitride film 37 of the laminated film patterns $38_1$ to $38_4$ as a nonoxidant mask so as to form thick field oxide films 41 of about 0.7 to 1.2 μm thickness and an isolation film 41' (FIG. 3D).

Then, the n-type element region for the npn bipolar transistor, the p-type element region for the n-channel MOS transistor, and the n-type element region for the p-channel MOS transistor are formed which are surrounded by the field oxide films 41. The isolation film 41' is formed in the element region for the npn bipolar transistor so as to obtain a transistor of a walled-base structure.

The thermal oxide film 36 of the laminated film patterns $38_1$ to $38_4$ serves to buffer the stress acting on the surface of the epitaxial silicon layer 33 during selective oxidation.

Figure 3E:
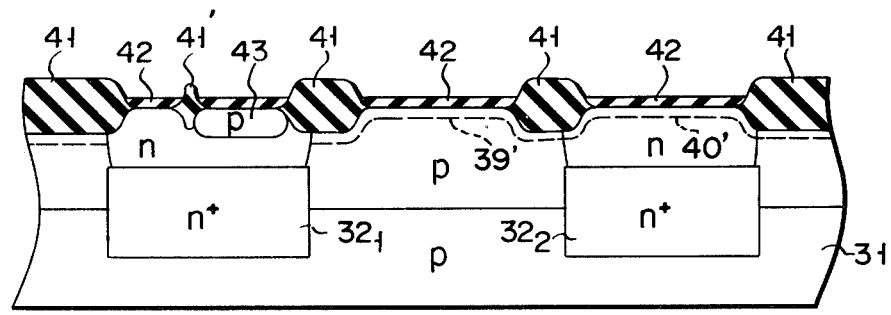

(v) After the silicon nitride film 37 and the thermal oxide film 36 covering the respective element regions are sequentially etched, still another thermal oxide film 42 of 200 to 1,000 Å thickness is formed to cover the element regions. The thermal oxide film 42 serves as gate oxide films of the CMOS transistors. After selective ion-implanting of boron, annealing or diffusion slumping of boron at 1,000° to 1,100° C. is performed so as to form an active base region 43 (an internal base region of the draft base structure) having a sheet resistance $ps$ of 500 to 1,000 Ω/□ (FIG. 3E).

During ion-implantation of boron, the non-implanted portions are protected by a resist pattern, and the isolation film 41' and the field oxide films 41 are used as a blocking mask. Therefore, the active base region 43 is formed to have a walled-base structure such that it is in contact with the oxide films 41 and 41'.

If necessary, channel ion-implantations 39' and 40' are respectively performed so as to control the threshold voltages of the n- and p-channel MOS transistors.

Figure 3F:
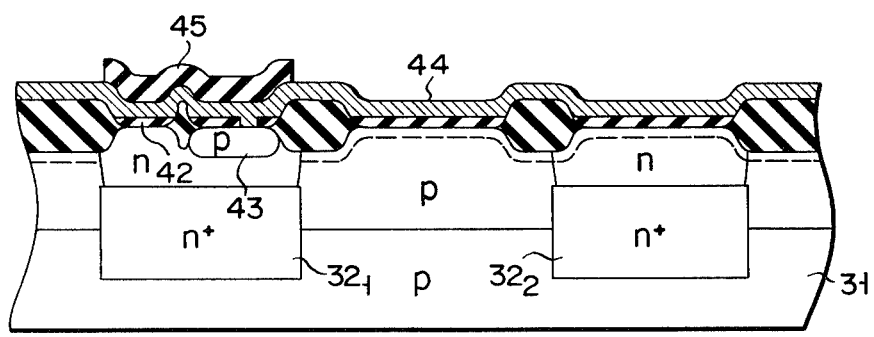

(vi) After forming an emitter diffusion window in the thermal oxide film 42 covering the surface of the active base region 43, a polysilicon layer 44 is formed on the entire surface by the CVD method. After covering the prospective element region for the npn bipolar transistor by a CVD-SiO2 film pattern 45, phosphorus of high concentration is diffused from a diffusion source of POCl3 Ior the like so as to dope phosphorus on the part of the polysilicon layer 44 which covers the CMOS regions, thereby giving a low sheet resistance $ps$ of 20 Ω/□ (FIG. 3F). After removing the CVD-SiO2 film 45, arsenic is ion implanted on the entire surface or only the surface portion which has been covered with the CVD-SiO2 film pattern 45, under the conditions of an acceleration voltage of 150 keV and a dose of 5 to $15 \times 10^{15}/cm^2$. Annealing is then performed to dope arsenic in the portion of the polysilicon layer 44 which corresponds to the prospective element region of the npn bipolar transistor.

Alternatively, after forming an arsenic-doped polysilicon layer 44 by the CVD method, phosphorus is diffused to a high concentration in the prospective CMOS regions in the same manne as described above.

Figure 3G:
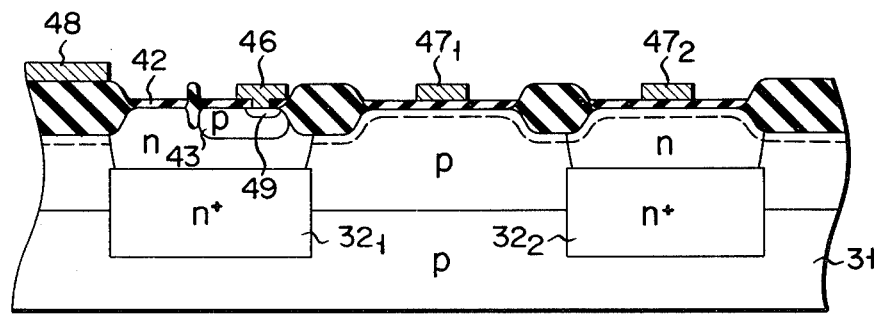

(vii) The polysilicon layer 44 is then patterned to form an arsenic-doped emitter electrode 46 which contacts the active base region 43 through the emitter diffusion window and to form a gate electrode 47$_1$ of the n-channel MOS transistor, a gate electrode 47$_2$ of the p-channel MOS transistor and, if necessary, a polysilicon resistor 48. Arsenic is thermally diffused using the emitter electrode 46 as a diffusion source so as to form an n-type emitter region 49 in self-alignment (FIG. 3G).

Since arsenic, which has a small diffusion coefficient, is used for forming the emitter region 49, an npn transistor which has a high cutoff frequency and a small power consumption may be obtained with a sufficiently shallow emitter region. This method is also effective in obtaining a high current amplification factor.

When the polysilicon resistor 48 is formed, the resistance of this resistor is controlled by doping of boron. This is because boron can diffuse deeply and uniformly in comparison with other impurities. In this case, prior to doping with phosphorus and arsenic as shown in FIG. 3F, boron is selectively ion-implanted in the prospective resistor forming region and is annealed thereafter. With this method, a polysilicon resistor 48 having a small variation in resistance and good temperature characteristics may be easily obtained. A high resistance may also be obtained by controlling the dosage of boron.

Similarly, the gate electrode 47$_2$ of the p-channel MOS transistor can be givin a low resistance by doping of boron.

Figure 3H:
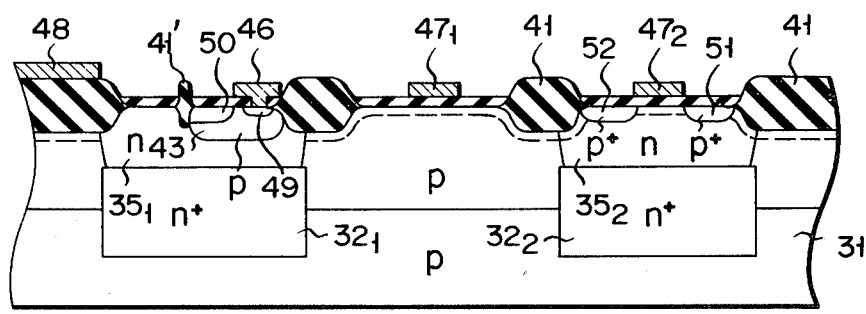

(viii) Boron is then selectively ion-implanted so as to simultaneously form a p$^+$-type external base region 50 for the npn bipolar transistor, and a p$^+$-type source region 51 and a p$^+$type drain region 52 for the p-channel MOS transistor. (FIG. 3H)

At this time, in the p-channel MOS transistor region, boron is ion-implanted using the gate electrode 47$_2$ and the field oxide films 41 as a blocking mask, so that the source and drain regions 51 and 52 are formed in self-alignment. In the npn bipolar transistor region, boron is ion-implanted using the emitter electrode 46 and the isolation film 41' as a blocking mask, so that the p$^+$-type external base region 50 is also formed in self-alignment. This self-alignment allows miniaturization of the elements and contributes to high switching speed characteristics of the transistors. Unlike the conventional method, the source and drain regions 51 and 52 are formed to be shallower than the base region 43, so that parasitic capacitance is reduced, miniaturization of the CMOS transistors is facilitated, and high switching speed of the CMOS transistors is realized.

It is preferable to ion-implant boron also in the contact formation region of the polysilicon resistor 48.

Figure 3I:
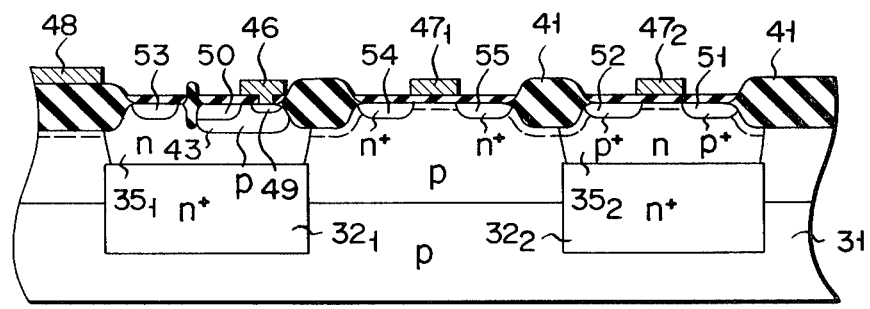

(ix) Arsenic is then selectively doped so as to simultaneously form an n$^+$-type collector contact region 53 of the npn bipolar transistor, and an n$^+$-type source region 54 and an n$^+$-type drain region 55 of the n-channel MOS transistor (FIG. 3I).

Since the source and drain regions 54 and 55 of the n-channel MOS transistor are formed in self-alignment, element miniaturization is facilitated and high switching speed of the CMOS transistors is achieved.

Figure 3J:
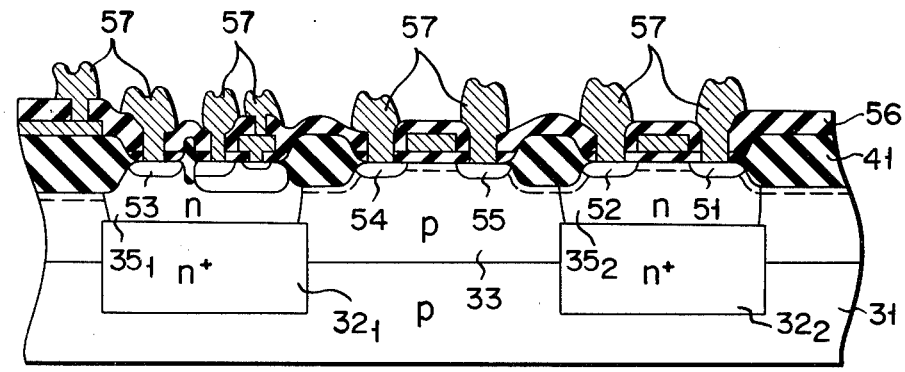

(x) Thereafter, an insulating interlayer 56 such as a PSG film (phosphosilicate glass film) or the like is deposited on the entire surface by a conventional method. Contact holes are formed in the insulating interlayer 56, and a wiring metal film is deposited and patterned to form a metal wiring layer 57 so as to complete the Bi-CMOS structure (FIG. 3J). Although not shown in the figure, the metal wiring layer 57 is formed to be in ohmic contact with the n-type well 35$_2$ so as to stabilize its potential (generally fixed at the source potential).

According to the method described above, a Bi-CMOS structure may be obtained which includes an npn bipolar transistor having a high cutoff frequency ($f_T = 3 \sim 4$ GHz), low power consumption and low noise, and CMOS transistors having high switching speed characteristics. Since the emitter region 49 of the npn bipolar transistor is formed by arsenic diffusion from the emitter electrode 46, a high current amplification factor may be obtained with a shallow junction.

In Example 1 described above, after doping the desired portion of the polysilicon layer 44 with a desired impurity, the emitter electrode 46 and the gate electrodes 47$_1$ and 47$_2$ are formed. However, after patterning the polysilicon layer 44 to form the emitter electrode 46 and the gate electrodes 47$_1$ and 47$_2$, these electrodes may be doped with the desired impurity.

The order of forming the p- and n-channel MOS transistors (i.e., the order of forming the external base region 50 and the collector contact region 53) may be reversed.

EXAMPLE 2

(i) Steps (i) to (v) in Example 1 (FIGS. 3A to 3E) are performed in a similar manner.

Figure 4A:
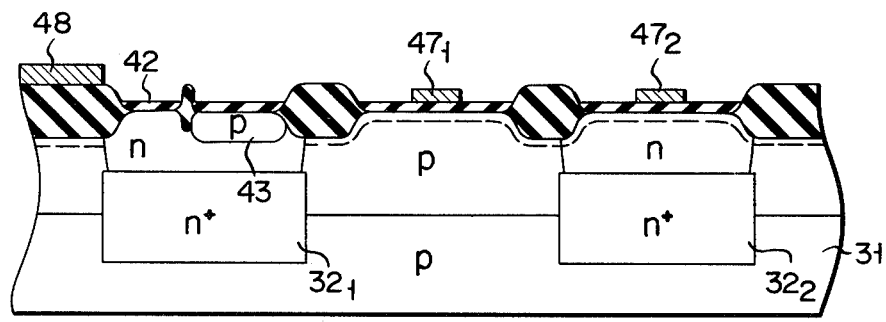
FIGS. 4A to 4C are sectional views showing in sequential order a method for manufacturing a Bi-CMOS structure according to another embodiment of the present invention.

(ii) After depositing a polysilicon layer 44 on the entire surface of the structure, the polysilicon layer 44 is patterned to form gate electrodes 47$_1$ and 47$_2$ of the CMOS transistors, a polysilicon resistor 48 and the like. An emitter electrode 46 is not formed (FIG. 4A).

Subsequently, required impurities are doped in the gate electrodes 47$_1$ and 47$_2$ and the polysilicon resistor 48 by the methods as described in Example 1.

Figure 4B:
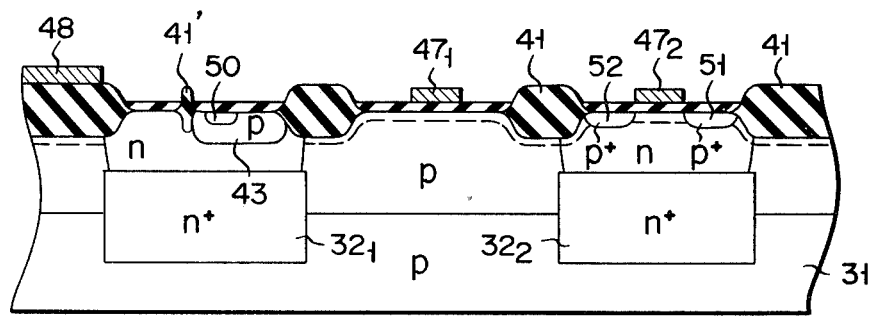

(iii) Following the same procedure as in Example 1, a p$^+$-type external base region 50 of the npn bipolar transistor and p$^+$-type source and drain regions 51 and 52 of the p-channel MOS transistor are simultaneously formed (FIG. 4B).

Figure 4C:
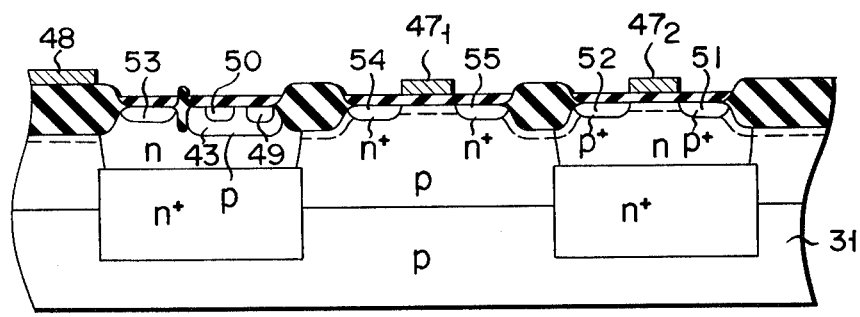

(iv) Arsenic is then selectively ion-implanted to form an n$^+$-type collector contact region 53 of the npn bipolar transistor, n$^+$-type source and drain regions 54 and 55 of the n-channel MOS transistor, and an n$^+$-type emitter region 49 of the npn bipolar transistor (FIG. 4C).

The procedures of Example 1 are followed to perform a Bi-CMOS structure.

As can be seen from the above description, the essential effects of this invention may be obtained in Example 2.

EXAMPLE 3

(i) A silicon wafer of the structure as shown in FIG. 3A is prepared in the same manner as in step (i) of Example 1.

Figure 5:
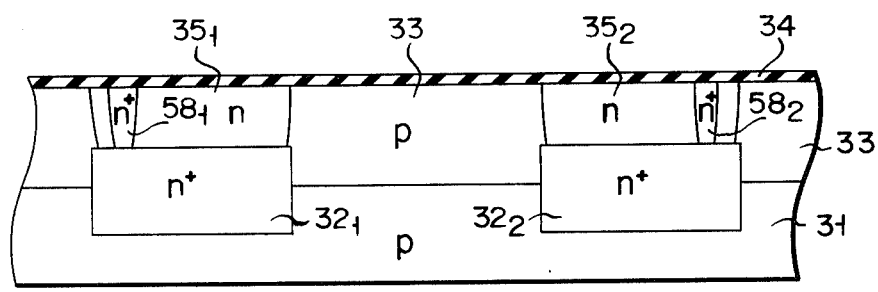
FIGS. 5 and 6 are sectional views for explaining still another embodiment of the present invention.

(ii) When forming n-type wells 35$_1$ and 35$_2$ as in step (ii) of Example 1, n$^+$-type connecting regions 58$_1$ and 58$_2$ are formed in the n-type wells 35$_1$ and 35$_2$, which reach the n$^+$-type buried regions 32$_1$ and 32$_2$ (FIG. 5).

The n$^+$-type connecting regions 58$_1$ and 58$_2$ may be formed by utilizing, for example, part of the annealing step for forming the n-type wells 35$_1$ and 35$_2$. More specifically, as in Example 1, after partly performing thermal diffusion of phosphorus for forming the n-type wells 35$_1$ and 35$_2$, a diffusion source for the n$^+$-type connecting regions 58$_1$ and 58$_2$ is selectively formed by ion-implantation of phosphorus (or by thermal diffusion from silicon glass containing phosphorus and arsenic).

Then, the diffusion source is slumped by the remaining annealing step for forming the n-type wells $35_1$ and $35_2$.

Of the n+-type connecting regions $58_1$ and $58_2$, the n+-type connecting region $58_1$ formed in the n-type well $35_1$ of the npn bipolar transistor is formed in the prospective region for forming the collector contact region 53 of the npn bipolar transistor. Meanwhile, the n+-type connecting region $58_2$ formed in the n-type well $35_2$ of the p-channel MOS transistor is formed in the prospective region for forming an electrode for fixing the potential of the n-type well $35_2$.

(iii) The procedures of steps (iii) to (ix) in Example 1 are followed to obtain a Bi-CMOS structure.

According to this example, the collector resistance of the npn bipolar transistor is decreased and the ON resistance is reduced by the n+-type connecting region $58_1$ formed in the n-type well $35_1$ of the bipolar transistor.

Furthermore, the n+-type connecting region $58_2$ formed in the n-type well $35_2$ of the p-channel MOS transistor serves to prevent the latch up phenomenon of the CMOS transistors. The latch up phenomenon will be described briefly with reference to FIG. 3J.

The p-channel MOS transistor operates normally when its p+-type source and drain regions 51 and 52 and the n-type well $35_2$ are reverse biased. For this reason, as described above, a metal wiring layer (not shown) is formed which is in ohmic contact with the n-type well $35_2$ so as to fix the potential of the n-type well $35_2$ and to obtain reverse bias toward the source and drain regions 51 and 52. However, due to the voltage drop across the n-type well $35_2$ itself, the source and drain regions 51 and 52 and the n-type well $35_2$ may be forward biased. Then, a parasitic pnp transistor having the source and drain regions 51 and 52 as the emitter, the n-type well $35_2$ as the base and the p-type epitaxial silicon layer 33 as the collector, operates, and a current flows into the substrate 31. This phenomenon is called the latch up phenomenon. Once the latch up phenomenon has occurred, the CMOS can not be operated normally thereafter.

As may be seen from the above description, the latch up phenomenon is mainly attributable to the voltage drop across the resistance of the n-type well $35_2$. Therefore, by forming the n+-type connecting region $58_2$ as shown in FIG. 5 to decrease the series resistance, such erratic operation can be prevented.

Although two n+-type connecting regions $58_1$ and $58_2$ are formed in Example 3 described above, only one of them may be formed, depending upon individual Bi-CMOS characteristics.

EXAMPLE 4

In the Bi-CMOS structure shown in FIG. 3J, electrical isolation of the respective elements is obtained by the p-n junctions between the n-type wells $35_1$ and $35_2$ and the p-type epitaxial silicon layer 33. However, in such a structure, when the npn bipolar transistor operates in the saturation region, a current flows to the p-type substrate 31 and the layer 33 to cause fluctuations in the ground potential of the p-type substrate 31. This causes the erratic operation mode (e.g., the latch up phenomenon of the CMOS) of the Bi-CMOS structure. Furthermore, since a relatively high resistance is involved in grounding the layer 33 of the n-channel MOS transistor, the latch up phenomenon of the CMOS is more easily caused.

Example 4 is effective in solving this problem and involves the following steps.

(i) A silicon wafer as shown in FIG. 3A is prepared by the step (i) of Example 1.

Figure 6:
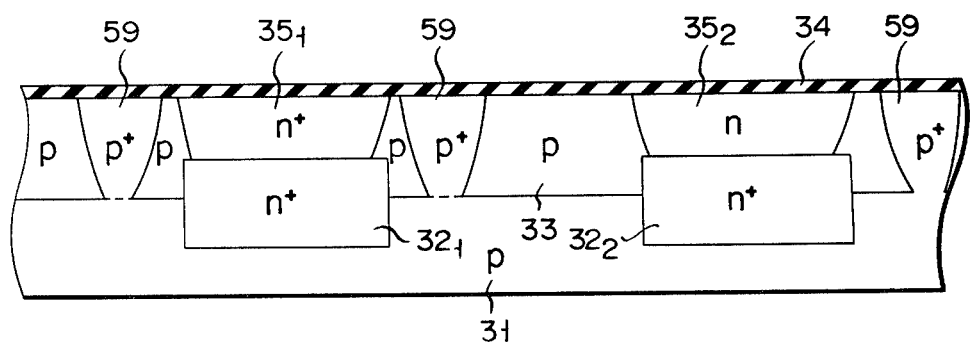

(ii) Following the same procedures of Example 1, n-type wells $35_1$ and $35_2$ are formed, while a p+-type diffusion layer 59 reaching a p-type silicon substrate 31 is formed to surround the n-type well $35_1$ of the npn bipolar transistor and in a p-type epitaxial silicon layer 33. (FIG. 6).

The p+-type diffusion layer 59 may be formed by utilizing the annealing step for forming the n-type wells $35_1$ and $35_2$. More specifically, a diffusion source for the n-type wells $35_1$ and $35_2$ is formed in the same manner as in Example 1. A difusion source for the p+-type diffusion layer 59 is formed by ion-implantation of boron or thermal diffusion from a boron-doped polysilicon layer. Boron is diffused from the boron diffusion source in the annealing step for forming the n-type wells $35_1$ and $35_2$. If there is a time difference between the formation of the p+-type diffusion layer 59 and formation gf the n-type wells $35_1$ and $35_2$, the formation step for the diffusion source, which requires a shorter time, may be included in the other formation step.

(iii) A Bi-CMOS structure is obtained as in Example 1.

According to Example 4, since the p+-type diffusion layer 59 is formed, the series resistance for grounding the layer 33 of the n-channel MOS transistor is significantly reduced.

Since the current which flows when the npn bipolar transistor operates in the saturation region flows to the surface through the p+-type diffusion layer 59 having a low resistance, this current does not flow to the substrate 31 and the layer 33 to cause the latch up phenomenon or the erratic operation mode.

Examples 1 to 4 are described with reference to a method for forming on a single substrate a vertical npn transistor as a bipolar transistor and a CMOS structure. However, a process for forming a vertical npn bipolar transistor generally allows formation of a lateral pnp bipolar transistor. Therefore, the method of the present invention may be applied to formation on a single substrate of a lateral pnp transistor and a CMOS.

The present invention is similarly applicable to a method for manufacturing a vertical pnp bipolar transistor or a lateral npn transistor on a single substrate in place of the vertical npn transistor together with a CMOS.

Furthermore, the present invention is not limited to a Bi-CMOS structure in which an analog integrated circuit of a bipolar transistor is formed together with a CMOS logic circuit. For example, the present invention may be applied to a method for manufacturing a Bi-MOS structure in which a high-speed bipolar logic circuit consisting of a bipolar transistor such as an emitter-coupled logic (ECL) is formed together with a CMOS logic circuit.

In summary, according to the present invention, a bipolar transistor and CMOS transistors may be formed on a single substrate while securing the optimal characteristics of both types of transistors.

What is claimed is:

1. A method for manufacturing a semiconductor device, comprising the steps of: selectively forming, in a surface layer of a semiconductor substrate of a first conductivity type, a plurality of high concentration buried layers having a second conductivity type, and growing an epitaxial semiconductor layer of the first conductivity type on an entire surface of said substrate;

forming well regions of the second conductivity type which extend from a surface of said epitaxial semiconductor layer to said high concentration buried layers; selectively forming a field insulating film on the surface of said epitaxial semiconductor layer so as to form first conductivity type element regions and second conductivity type element regions surrounded by said field insulating film; forming a thin insulating film on surfaces of said element regions; selectively doping one of said second conductivity type element regions with a first conductivity type impurity so as to form a first conductivity type active base region of a bipolar transistor; forming gate electrodes of MOS transistors interposed with said insulating film on said first conductivity type element regions and remaining ones of said second conductivity type element regions in which said active base region is not formed, said gate electrodes comprising polysilicon layers which are doped with an impurity to have a low resistance; forming a second conductivity type emitter region in said first conductivity type active base region; selectively doping a second conductivity type impurity so as to simultaneously form a second conductivity type collector contact region of said bipolar transistor, and second conductivity type source and drain regions of said MOS transistors in said first conductivity type element region, said second conductivity type source and drain regions being self-aligned with said gate electrodes of said MOS transistors; and selectively doping a first conductivity type impurity so as to form an external base region of the first conductivity type in said first conductivity type base region and first conductivity type source and drain regions of said MOS transistors in said remaining ones of said second conductivity type element regions, said first conductivity type source and drain regions being self-aligned with said gate electrodes of said MOS transistors.

2. A method according to claim 1, wherein the step for forming said second conductivity type collector contact region and the step for forming said second conductivity type source and drain regions are performed simultaneously.

3. A method according to claim 1, further comprising the steps of: forming an emitter diffusion window in said thin insulating film on said active base region after said first conductivity type active base region is formed; forming an emitter electrode which consists of a polysilicon layer doped with the second conductivity type impurity to have a low resistance and which is in contact with said first conductivity type active base region through said emitter diffusion window, simultaneously as said gate electrodes of said MOS transistors comprising said polysilicon layers having the low resistance are formed by doping of said impurity; and performing impurity diffusion using said emitter electrode as a diffusion source so as to form said second conductivity type emitter region in said first conductivity type active base region.

4. A method according to claim 3, wherein said first conductivity type external base region is formed in self-alignment with said emitter electrode.

5. A method according to claim 1, wherein said gate electrodes of said MOS transistors comprise gate electrodes which have a low resistance due to doping with phosphorus and arsenic.

6. A method according to claim 1, wherein among said gate electrodes of said MOS transistors, said gate electrode of said p-channel MOS transistor comprises a gate electrode which has a low resistance by doping with boron, and said gate electrode of said n-channel MOS transistor comprises a gate electrode which has a low resistance due to doping with phosphorus and arsenic.

7. A method according to claim 3, wherein said emitter electrode is doped with arsenic as the second conductivity type impurity.

8. A method according to claim 3, wherein a collector electrode comprising a polysilicon layer doped with the second conductivity type impurity is formed, and said second conductivity type collector contact region is formed using said collector electrode as a diffusion source in a similar manner to said second conductivity type emitter region.

9. A method according to claim 8, wherein said collector electrode comprising said polysilicon layer doped with the second conductivity type impurity to be used as said diffusion source for forming said second conductivity type collector contact region is formed simultaneously with said emitter electrode.

10. A method according to claim 8, wherein said collector electrode used as said diffusion source for forming said second conductivity type collector contact region comprises, as said gate electrodes of said MOS transistors, a polysilicon layer which has a low resistance due to doping with phosphorus or phosphorus and arsenic.

11. A method according to claim 1, wherein in the step for forming said gate electrodes of said MOS transistors, polysilicon resistor whose resistance has been controlled by doping of an impurity is formed on said field insulating film.

12. A method according to claim 11, wherein the resistance of said polysilicon resistor is controlled by doping of boron.

13. A method according to claim 1, wherein in the step for forming said second conductivity type wells, second conductivity type high-concentration connecting regions are formed which extend from surfaces of said second conductivity type wells to said second conductivity type high-concentration buried layers.

14. A method according to claim 1, wherein in the step for forming said second conductivity type wells, a first conductivity type high-concentration impurity diffusion layer surrounding the well is formed in said first conductivity type epitaxial semiconductor layer, which extends from the surface of said first conductivity type epitaxial semiconductor layer to said first conductivity type semiconductor substrate.

* * * * *